United States Patent [19]

Hosomi et al.

[11] Patent Number: 5,976,699

[45] Date of Patent: *Nov. 2, 1999

[54] INSULATING ADHESIVE FOR MULTILAYER PRINTED CIRCUIT BOARD

[75] Inventors: Takeshi Hosomi; Toyoaki Kishi; Tomoyoshi Honjoya; Sei Nakamichi; Masahiro Mitsui, all of Fujieda, Japan

[73] Assignee: Sumitomo Bakelite Company Limited, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/728,800

[22] Filed: Oct. 10, 1996

[30] Foreign Application Priority Data

Nov. 9, 1995 [JP] Japan .................................. 7-291171
Aug. 9, 1996 [JP] Japan .................................. 8-211042

[51] Int. Cl.$^6$ ..................................................... B32B 15/08
[52] U.S. Cl. ........................... 428/418; 428/901; 525/524; 525/930
[58] Field of Search ................... 525/524, 930; 428/418, 901; 29/829, 846

[56] References Cited

U.S. PATENT DOCUMENTS

| | | | |
|---|---|---|---|
| 3,395,118 | 7/1968 | Reinking et al. | 525/930 |
| 3,873,637 | 3/1975 | Fujiwara et al. | 525/930 |
| 3,888,942 | 6/1975 | Tsen | 525/930 |
| 4,186,036 | 1/1980 | Elms et al. | 525/396 |
| 4,532,308 | 7/1985 | Sato et al. | 525/482 |
| 4,769,399 | 9/1988 | Schenz | 525/930 |
| 5,278,259 | 1/1994 | Futakuchi et al. | 525/930 |
| 5,302,666 | 4/1994 | Hino et al. | 525/488 |

FOREIGN PATENT DOCUMENTS

| | | | |
|---|---|---|---|
| 55-147572 | 11/1980 | Japan | 525/930 |
| 61-60761 | 3/1986 | Japan . | |

OTHER PUBLICATIONS

Japan Abstract, JP7170073, vol. 95, No. 10, Jul. 4, 1995.
Japan Abstract, JP8157566, vol. 96, No. 10, Jun. 18, 1996.
Japan Abstract, JP8111585, vol. 96, No. 8, Apr. 30, 1996.
Japan Abstract, JP7245480, vol. 96, No. 1, Sep. 19, 1995.
Japan Abstract, JP7202418, vol. 95, No. 11, Aug. 4, 1995.

*Primary Examiner*—Robert Dawson
*Assistant Examiner*—D. Aylward
*Attorney, Agent, or Firm*—Browdy and Neimark

[57] ABSTRACT

An insulating adhesive for a multilayer printed circuit board, which is to be laminated to an internal layer circuit board coated with an undercoating agent comprising an epoxy resin and a curing agent therefor, and which comprises as essential components:

(a) a bisphenol type epoxy resin or phenoxy resin having a weight average molecular weight of at least 10,000, (b) a bisphenol type epoxy resin having an epoxy equivalent of not more than 500, and (c) an epoxy resin curing agent, said insulating adhesive being excellent in storage stability in the form of a varnish or as coated on a copper foil, and when coated on an internal layer circuit board coated with an undercoating agent, being able to be well integrally cured with the undercoating agent.

20 Claims, 1 Drawing Sheet

INSULATING ADHESIVE FOR MULTILAYER PRINTED CIRCUIT BOARD

BACKGROUND OF THE INVENTION

1. Field of the Invention

This invention relates to an insulating adhesive for use between circuit layers of a multilayer printed circuit board, and more particularly to an insulating adhesive of an epoxy resin type which is excellent in storage stability and can be rapidly cured at a high temperature of at least 100° C., and which is preferably flame-retardant.

2. Description of the Related Art

In the production of a multilayer printed circuit board, there has been used a process which comprises putting at least one sheet of a prepreg obtained by impregnating a glass cloth substrate with an epoxy resin and semi-curing the resin, on an internal layer circuit board on which a circuit has been formed and further putting a copper foil on the prepreg sheet and then molding the resulting assembly under pressure by a hot plate press. However in this process, the resin in the prepreg is allowed to flow again by heat and cured under a given pressure, and hence a period of 1 to 1.5 hours is required for uniformly curing and molding the prepreg. Since the production process requires such a long period of time and in addition a hot plate press and a glass cloth prepreg are necessary, the production cost becomes high. Moreover, since a method of impregnating a glass cloth with a resin is carried out, the thickness between the circuit layers is controlled by the thickness of the glass cloth, and hence, it has been difficult to make very thin the whole of the multilayer printed circuit board.

Recently, for solving the above problems, attention has been paid again to a technique of preparing a multilayer printed circuit board by a build-up system in which neither the heat-pressure molding by a hot plate press nor the glass cloth as an insulator between layers are used.

The present inventors have made extensive research on a process for producing a multilayer printed circuit board at a low cost by a simplified build-up system.

JP-A 7-202418 of the same as the present inventors discloses an insulating adhesive similar to the present one; however, no internal layer circuit board coated with an undercoating agent is used and hence the multilayer printed circuit board is insufficient in surface smoothness because of the difference in level between the insulating substrate and the circuit in the internal layer circuit board and many voids remain therein. Therefore, it has been difficult to put the multilayer printed circuit board to practical use.

After that, it has been generalized that in the production of a multilayer printed circuit board by a build-up system, when an insulating resin layer in the form of a film is used, the internal layer circuit board is coated with an undercoating agent for removing (or diminishing) the difference in level between insulating substrate and circuit in the internal layer circuit board to make its surface smoother. A typical example thereof is a method which comprises laminating a copper foil coated with an insulating adhesive to an internal layer circuit board coated with an undercoating agent in the state that the undercoating agent has not been cured or has been semi-cured or cured and curing the insulating adhesive to obtain a multilayer printed circuit board. By such a method, the difference in length between insulating substrate and circuit in an internal layer circuit board is made small, and hence, the lamination of a copper foil coated with an insulating adhesive is made easy and the necessity to consider the proportion of the copper foil residue in the internal layer circuit board becomes a little.

In such a process, there have been caused such problems that the insulating adhesive coated on the copper foil is too much softened during the lamination to ensure the insulation film thickness between the circuit layers; that the melt viscosity is too much lowered during the heat-curing and hence wrinkle is caused on the copper foil; that during the storage thereof, curing reaction proceeds and hence when the copper foil coated by the adhesive is laminated to the internal layer circuit board coated with the undercoating agent the integral molding is not well conducted; and that the adhesive layer is too hard to follow-up the irregularities of the internal layer circuit board coated with the undercoating agent and hence molding voids are caused. Furthermore, since no glass fiber substrate is used in the insulating adhesive between the circuit layers, there is such a problem that flame-retardation is difficult.

Such a technique is disclosed in JP-A 7-245480 of the same inventors as the present inventors; however, in this technique, no curing agent is contained in the undercoating agent coated on the internal layer circuit board, so that when an insulating adhesive (similar to the insulating adhesive of this invention) is laminated to the internal layer circuit board coated with the undercoating agent and then heated, the curing is not effected sufficiently and it has been impossible to put this technique to practical use.

SUMMARY OF THE INVENTION

The present inventors have made research to solve the above problems and have completed this invention.

According to this invention, there is provided an insulating adhesive for a multilayer printed circuit board, which adhesive is to be laminated to an internal layer circuit board coated with an undercoating agent containing an epoxy resin and a curing agent therefor and comprises as essential components:

(a) a bisphenol type epoxy resin or phenoxy resin having a weight average molecular weight of at least 10,000, (b) a bisphenol type epoxy resin having an epoxy equivalent of not more than 500, and (c) an epoxy resin curing agent.

BRIEF DESCRIPTION OF THE DRAWING

In FIG. 1(A) to FIG. 1(C), 1 refers to an internal layer circuit board, 2 to an internal layer circuit, 3 to an undercoating agent, 4 to a thermosetting insulating adhesive, 5 to a copper foil, 6 to a rigid roll and 7 to a multilayer printed circuit board.

DETAILED DESCRIPTION OF THE INVENTION

Figure 1A:
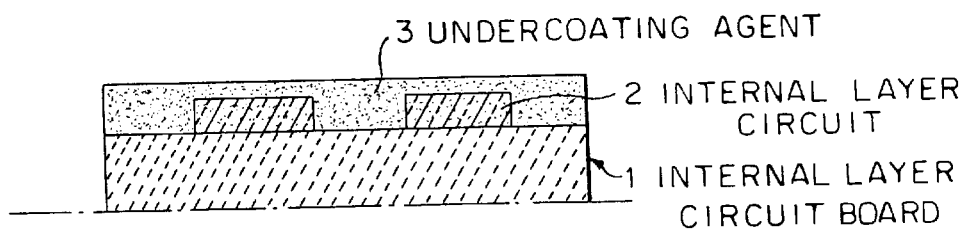
FIG. 1(A) to FIG. 1(C) are schematic sectional views explaining the process of preparing an example of a multilayer printed circuit board using the insulating adhesive of this invention.

In this invention, the bisphenol type epoxy resin or phenoxy resin (a) having a weight average molecular weight of at least 10,000 is blended for the purpose of diminishing the degree of softening of the resin during molding, keeping the thickness of an insulating layer and imparting a flexibility to the composition obtained. Said epoxy resin includes bisphenol A type epoxy resins, bisphenol F type epoxy resins and the like.

In addition to the above purposes, for imparting a flame retardancy to the composition, a brominated bisphenol type epoxy resin or brominated phenoxy resin having a bromination degree of 20% or more is preferred. Moreover, for enhancing the dissolution in other resins, solvents or the like, a brominated epoxy resin or brominated phenoxy resin having a repeating structure in which brominated bisphenol portion and unbrominated bisphenol portion are alternately arranged is preferred. The proportion of this high molecular weight epoxy resin or phenoxy resin is 55 to 90% by weight based on the total weight of all the resins. When the proportion is less than 55% by weight, the resin is too much softened by heating during lamination to ensure the insulation film thickness between circuit layers. In addition, there are caused such problems that the melt viscosity is too much lowered during heat-curing and wrinkle is formed on the copper foil. On the other hand, when the proportion is more than 90% by weight, the adhesive before curing is hard and lacks elasticity, so that the property of following-up the irregularities of the internal layer circuit board during laminating and the adhesiveness are inferior and molding voids are caused.

The bromination degree of the brominated epoxy resin or brominated phenoxy resin is 20% or more. When the bromination degree is less than 20%, the multilayer printed circuit board obtained cannot achieve V-0 of the nonflammability UL Standards.

When the above high molecular weight epoxy resin or phenoxy resin is used alone, the adhesive is poor in fitness and adhesiveness during laminating, insufficient in adhesiveness after lamination and too low in cross-linking density after curing to ensure heat resistance; and when the resin is dissolved in a solvent to form a varnish for coating a copper foil the viscosity thereof is so high that the fitness and workability during coating are not desirable. In order to overcome these drawbacks, the bisphenol type epoxy resin having an epoxy equivalent of not more than 500 is blended as a resin component which is liquid at a temperature not more than 50° C.

Said epoxy resin includes bisphenol A type epoxy resins, bisphenol F type epoxy resins and the like. When brominated products thereof are used, a flame retardancy is more effectively imparted to the multilayer printed circuit board. More specifically, those having an epoxy equivalent of about 200 and those having an epoxy equivalent of about 450 are used alone or in combination taking into-consideration the workability in coating a copper foil.

The epoxy resin curing agent includes amine compounds, imidazole compounds, acid anhydrides and the like and are not particularly limited. However, the imidazole compounds are preferred because they can sufficiently cure the epoxy resin even when used in a small amount and moreover the brominated epoxy resin can effectively exert its flame-retardancy. The imidazole compounds are particularly preferably those which are solid at room temperature, have a melting point of not less than 130° C., are low in solubility in epoxy resins and rapidly react with the epoxy resin when the temperature reaches a high temperature of not less than 150° C. Specifically, they include 2-methylimidazole, 2-phenylimidazole, 2-phenyl-4-methylimidazole, bis(2-ethyl-4-methylimidazole), 2-phenyl-4-methyl-5-hydroxymethylimidazole, 2-phenyl-4,5-dihydroxymethylimidazole, triazine-addition type imidazole and the like. These imidazoles are uniformly dispersed in the form of fine powders in an epoxy resin varnish. In addition, since they are low in compatibility with the epoxy resin, no reaction proceeds at a temperature of room temperature to 100° C., and hence storage stability can be maintained well. When they are heated to not less than 150° C. in the curing of the laminate, they can react with the epoxy resin to prepare a uniform cured product.

As another curing agent, there can be used acid anhydrides such as phthalic anhydride, tetrahydrophthalic anhydride, methyltetrahydrophthalic anhydride, methylendomethylene tetrahydrophthalic anhydride, methylbutenyltetrahydrophthalic anhydride, hexahydrophthatlic anhydride, methylhexahydrophthalic anhydride, trimellitic anhydride, pyromellitic anhydride, benzophenonetetracarboxylic anhydride and the like; amine complex of boron trifluoride; dicyandiamide; derivatives of dicyandiamide; and the like. Epoxy adducts of the above compounds and microcapsules of the above compounds can also be used.

The acid anhydride curing agents are preferred because the amount of heat generated during the reaction is small. Among them, liquid acid anhydrides such as methyltetrahydrophthalic anhydride, methylendomethylene tetrahydrophthalic anhydride, methylbutenyltetrahydrophthalic anhydride, hexahydrophthalic anhydride, methylhexahydrophthalic anhydride and the like are more preferable, because they are easy to handle and contribute to the property of following-up the irregularities of internal layer circuit board and the adhesiveness during the laminate-molding.

In addition to the above epoxy resins and curing agent, there can be added components which can react with the epoxy resins and curing agent. Said components include, for example, reactive epoxy diluents (including phenyl glycidyl ether and like as a monofunctional type; resorcin diglycidyl ether, ethylene glycol glycidyl ether and the like as a difunctional type; glycerol triglycidyl ether and the like as a trifunctional type); resole type or novolak type phenol resins; isocyanate compounds; and the like.

In addition to the above-mentioned components, molten silica, crystalline silica, calcium carbonate, aluminum hydroxide, alumina, clay, barium sulfate, mica, talc, white carbon, E glass fine powder and the like can be blended in a proportion of not more than 40% by weight of the resin content in order to enhance the linear expansion coefficient, heat resistance, flame resistance and the like of the adhesive. When the proportion is more than 40% by weight, the viscosity of the adhesive becomes high and the filling property in between the internal layer circuits becomes low.

Furthermore, there can be added a silane coupling agent such as an epoxy silane or the like or a titanate type coupling agent in order to enhance the adhesiveness with a copper foil and an inner layer circuit board and the humidity resistance, a defoaming agent in order to prevent voids from being formed, or a flame retardant in the form of a liquid or fine powders.

As the solvent, there must be selected those which do not remain in the adhesive after the adhesive coated on a copper foil has been dried at 80–130° C. For example, acetone, methyl ethyl ketone, toluene, xylene, n-hexane, methanol, ethanol, methyl Cellosolve, ethyl Cellosolve, cyclohexanone and the like can be used.

The insulating adhesive-coated copper foil is prepared by coating an adhesive varnish in which the adhesive components are dissolved in a given solvent on the roughened surface of a copper foil, and thereafter drying the coated copper foil at 80–130° C. so that the solvent does not remain in the adhesive. The thickness of the adhesive layer is preferably 15–120 μm. When the thickness is less than 15 μm, the insulating properties between the layers become insufficient, and when the thickness is more than 120 μm, the coating is not easy though the insulating properties between the layers have no problem, and such a large thickness does not meet the purpose of this invention, that is, the thinning of the multilayer printed circuit board.

The insulating adhesive-coated copper foil is usually laminated to an internal layer circuit board coated with an undercoating agent by a dry film laminator and then the adhesive is cured together with the undercoating agent, whereby a multilayer printed circuit board having an outer layer circuit copper foil can be easily formed.

The undercoating agent used for removing or diminishing the difference in level between insulating substrate and circuit in the internal layer circuit board is explained below. Since the undercoating agent is usually integrally cured with the insulating adhesive between circuit layers, the same type of material (epoxy resin and curing agent) as the latter is used as the former. Accordingly, in the case of the insulating adhesive of this invention, usually, an undercoating agent comprising an epoxy resin, preferably a brominated epoxy resin as the main component is used. However, the undercoating agent may be in the form of a varnish wherein it is dissolved in a solvent or a reactive diluent which reacts upon exposing to heat or light. Such an undercoating agent varnish is coated on the internal layer circuit board, and subsequently heated to evaporate the solvent or cause reaction, thereby making it tack-free or prepolymerizing it, or alternatively irradiated with a light to cause reaction, thereby making it tack-free or prepolymerizing it. Thereafter, the insulating adhesive-coated copper foil is laminated to the internal layer circuit board coated with the undercoating agent varnish and the resulting assembly is subjected to integral curing.

The outline of a process for producing a multilayer printed circuit board using the insulating adhesive of this invention is explained below referring to FIG. 1(A) to FIG. 1(C).

FIG. 1(A): A liquid undercoating agent (3) is coated on an internal circuit board (1) by a screen printing or using a conventional coating means such as a roller coater, a curtain coater or the like in such a thickness that one surface of the internal layer circuit board (1) is completely covered with the undercoating agent (3). When the degree of filling is insufficient, it follows that air is caught up during the subsequent lamination. Thereafter, the undercoating agent is made tack-free by irradiation with a light by an exposing machine such as a UV conveyor or the like. Subsequently, the other surface of the internal layer circuit board (1) is coated with an undercoating agent (3) in the same manner [this step is omitted in FIG. 1(A)].

Figure 1B:
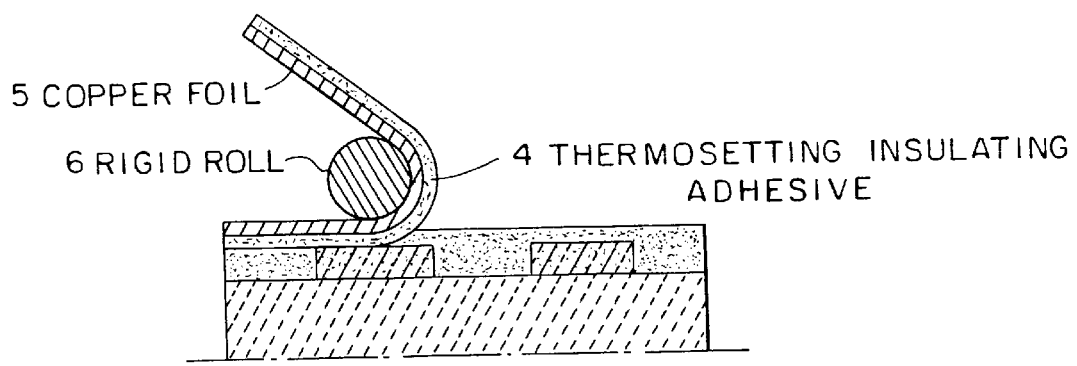

FIG. 1(B): A copper foil (5) provided with a thermosetting type insulating adhesive (4) is laminated to the surface of the tack-free undercoat layer coated on the internal layer circuit board. As the laminator, for example, a pair of rigid rolls (6) covered with a silicone rubber are used for achieving surface smoothness and the copper foils with insulating adhesive are laminated on both surfaces of the internal layer circuit board (1). The laminating conditions are varied depending upon the pattern of the internal layer circuit; however, the lamination is usually conducted at a pressure of about 0.5 to 6 kgf/cm$^2$ at a surface temperature of from room temperature to about 100° C. at a laminating speed of about 0.1 to 6 m/min. Under such conditions, the photopolymerized undercoating agent can achieve the surface smoothness by use of the rigid roll (6). In this case, the thickness of a layer between the internal layer circuit (2) and the copper foil (5) can be achieved by the thickness of the insulating adhesive (4).

Figure 1C:
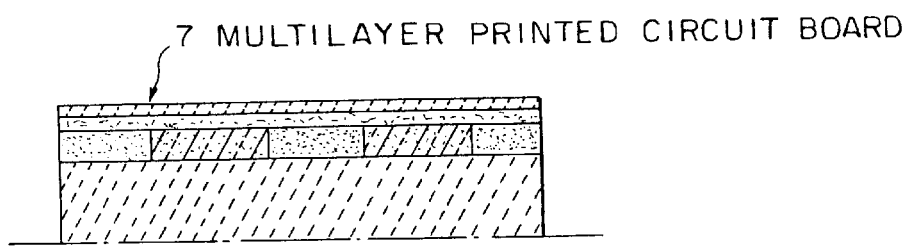

FIG. 1(C): Subsequently, the undercoating agent (3) and the thermosetting type insulating adhesive (4) coated on the copper foil are simultaneously integrally cured by heating to prepare a multilayer printed circuit board.

The insulating adhesive for a multilayer printed circuit board of this invention is excellent in storage stability in the form of a varnish or as coated on a copper foil, and when laminated to an internal layer circuit board coated with an undercoating agent and heated, can be well integrally cured with the undercoating agent. The multilayer printed circuit board obtained is excellent in not only electrical characteristics but also heat resistance, moisture resistance and the like.

DESCRIPTION OF THE PREFERRED EMBODIMENTS

Examples are shown below to explain this invention in more detail. However, the Examples are merely by way of illustration and not by way of limitation. In the Examples, parts are by weight unless otherwise specified.

EXAMPLE 1

In methyl ethyl ketone were dissolved 100 parts of a brominated phenoxy resin (bromination degree: 25%, weight average molecular weight: 30,000) and 50 parts of a bisphenol F type epoxy resin (epoxy equivalent: 175, molecular weight: 380), and to the solution were added 5 parts of 2-methylimidazole as a curing agent, 0.3 part of a titanate type coupling agent (KR-46B, a trade name of Ajinomoto Co., Inc.) and 30 parts of calcium carbonate to prepare an adhesive varnish.

Subsequently, a multilayer printed circuit board was prepared according to the process shown in FIG. (A) to FIG. (C).

The above-mentioned adhesive varnish was coated on the roughened surface of a copper foil having a thickness of 18 μm (5) by a roller coater so that the thickness after drying became 50 μm, and then dried to obtain an adhesive-coated copper foil (5).

Separately, 100 parts of a bisphenol A type epoxy resin (epoxy equivalent: 470, weight average molecular weight: about 900) was dissolved in 40 parts of glycidyl methacrylate, and to the solution were added 3 parts of 2-methylimidazole as a curing agent and 1.2 parts of a photopolymerization initiator (Irgacure 651, a trade name of Ciba Geigy), and the resulting mixture was thoroughly stirred in a homomixer to prepare an undercoating agent.

A glass epoxy double-side copper-clad laminate having a substrate thickness of 0.1 mm and a copper foil thickness of 35 μm was subjected to pattern processing to obtain an internal layer circuit board. The surface of the copper foil was subjected to blacking treatment, and coated with the above-mentioned undercoating agent in a thickness of about 40 μm by a curtain coater. Subsequently, the resulting assembly was irradiated with ultraviolet rays under the condition of about 2 J/cm$^2$ using two high pressure mercury lamps of 80 W/cm to make the undercoating agent tack-free.

The above-mentioned insulating adhesive-coated copper foil was laminated to the internal layer circuit board having such an undercoating agent layer under the conditions of a temperature of 100° C., a pressure of 4 Kg/cm$^2$ and a lamination speed of 0.8 m/min using a rigid roll, and then heat-cured at 150° C. for 30 minutes to prepare a multilayer printed circuit board.

EXAMPLES 2 TO 4

The same procedure as in Example 1 was repeated, except that the imidazole used in each of the insulating adhesive and the undercoating agent was changed from 2-methylimidazole to 2-phenyl-4-methylimidazole (Example 2), 2-phenyl-4-methyl-5-hydroxymethylimidazole (Example 3) or 2-methylimidazolevinyltriazine adduct (Example 4), to prepare multilayer printed circuit boards.

EXAMPLE 5

In methyl ethyl ketone were dissolved 100 parts of a brominated phenoxy resin (bromination degree: 25%, weight average molecular weight: 30,000) and 35 parts of a bisphenol F type epoxy resin (epoxy equivalent: 175, molecular weight: 380), and to the solution were added 35 parts of methyltetrahydrophthalic anhydride as a curing agent, 0.5 part of 2-phenyl-4-methyl-5-hydroxymethylimidazole as a curing accelerator, 0.2 part of a titanate type coupling agent (KR-46B, a trade name of Ajinomoto Co., Inc.) and 20 parts of barium sulfate to prepare an adhesive varnish. Using this adhesive varnish, a multilayer printed circuit board was prepared in the same manner as in Example 1.

EXAMPLE 6

The same procedure as in Example 5 was repeated, except that the methyltetrahydrophthalic anhydride was replaced with methylendomethylene tetrahydrophthalic anhydride, to prepare a multilayer printed circuit board.

EXAMPLE 7

The same procedure as in Example 1 was repeated, except that a bromine-free bisphenol A type epoxy resin (epoxy equivalent: 6,400, weight average molecular weight: 30,000) was used, to prepare a multilayer printed circuit board.

The multilayer printed circuit boards obtained were subjected to measurement of surface smoothness, solder heat resistance after moistened, peeling strength and flame-retardancy to obtain the results shown in Table 1.

TABLE 1

| Example No. | Surface smoothness (μm) | Solder heat resistance after moistened | Peeling strength (kg/cm) | Flame retardancy |
|---|---|---|---|---|
| 1 | 5 | o | 1.4 | V-0 |
| 2 | 5 | o | 1.3 | V-0 |
| 3 | 5 | o | 1.3 | V-0 |
| 4 | 5 | o | 1.3 | V-0 |
| 5 | 3 | o | 1.4 | V-0 |
| 6 | 3 | o | 1.3 | V-0 |
| 7 | 5 | o | 1.4 | V-1 |

Measurement method
(1) Surface smoothness: R(max) was measured according to JIS B 0601.
(2) Solder heat resistance after moistened
Moisture absorption conditions: pressure cooker treatment at 125° C. at 2.3 atms. for 30 minutes.
Test conditions: the case where n=5 and all 5 test pieces were not blistered when floated on a solder bath at 260° C. for 120 sec. was indicated as "o".
(3) Peeling strength: According to JIS C 6486.
(4) Flame-retardancy: Measured according to UL-94.

What is claimed is:

1. A multilayer printed circuit board comprising an insulating adhesive laminated to an internal layer circuit board coated with an undercoating agent comprising an epoxy resin and a curing agent therefor, wherein said insulating adhesive comprises as essential components:
   (a) a bisphenol epoxy resin or phenoxy resin having a weight average molecular weight of at least 10,000,
   (b) a bisphenol epoxy resin having an epoxy equivalent of not more than 500, and
   (c) an epoxy resin curing agent consisting of at least one member selected from the group consisting of 2-methylimidazole, 2-phenylimidazole. 2-phenyl-4-methylimidazole, bis(2-ethyl-4-methylimidazole), 2-phenyl-4-methyl-5-hydroxymethylimidazole, 2-phenyl-4,5-dihydroxy-methylimidazole, triazine-addition imidazole, methyltetrahydrophthalic anhydride, methylendomethylene tetrahydrophthalic anhydride, methylbutenyltetrahydrophthalic anhydride, hexahydrophthalic anhydride, methyl-hexahydrophthalic anhydride, and mixtures thereof.

2. The multilayer printed circuit board according to claim 1, wherein the component (a) is contained in a proportion of 55–90% by weight based on the total weight of the component (a) and the component (b).

3. The multilayer printed circuit board according to claim 1, wherein the component (b) is a bisphenol epoxy resin having an epoxy equivalent of about 200 or a bisphenol epoxy resin having an epoxy equivalent of about 450 or a combination of the two.

4. The multilayer printed circuit board according to claim 1, wherein the component (a) is a brominated bisphenol epoxy resin or brominated phenoxy resin having a bromination degree of at least 20% and a weight average molecular weight of at least 10,000.

5. The multilayer printed circuit board according to claim 4, wherein the brominated bisphenol epoxy resin is produced from bisphenol A or a bisphenol F.

6. The multilayer printed circuit board according to claim 4, wherein the component (a) is contained in a proportion of 55–90% by weight based on the total weight of the component (a) and the component (b).

7. The multilayer printed circuit board according to claim 1, wherein the component (a) is a brominated bisphenol epoxy resin or brominated phenoxy resin which has a repeating structure wherein brominated bisphenol portion and unbrominated bisphenol portion are alternately arranged and which has a bromination degree of at least 20% and a weight average molecular weight of at least 10,000.

8. The multilayer printed circuit board according to claim 7, wherein the brominated bisphenol epoxy resin is produced from bisphenol A or a bisphenol F.

9. The multilayer printed circuit board according to claim 7, wherein the component (a) is contained in a proportion of 55–90% by weight based on the total weight of the component (a) and the component (b).

10. The multilayer printed circuit board according to claim 1, wherein the insulating is adhesive coated on a copper foil.

11. A multilayer printed circuit board comprising an insulating adhesive in dried and solid form laminated under heat and pressure to an internal layer circuit board with an undercoating agent comprising an epoxy resin and a curing agent therefor between said solid form insulating adhesive and said internal layer circuit board, wherein said insulating adhesive comprises as essential components:
   (a) a bisphenol epoxy resin or phenoxy resin having a weight average molecular weight of at least 10,000, (b) a bisphenol epoxy resin having an epoxy equivalent of not more than 500, and (c) an epoxy resin curing agent consisting of at least one member selected from the group consisting of 2-methylimidazole, 2-phenylimidazole. 2-phenyl-4-methylimidazole, bis(2-ethyl-4-methylimidazole), 2-phenyl-4-methyl-5-hydroxymethylimidazole, 2-phenyl-4,5-dihydroxy-methylimidazole, triazine-addition imidazole, methyltetrahydrophthalic anhydride, methylendomethylene tetrahydrophthalic anhydride, methylbutenyltetrahydrophthalic anhydride, hexahydrophthalic anhydride, methyl-hexahydrophthalic anhydride, and mixtures thereof.

12. The multilayer printed circuit board according to claim 11, wherein the solid form insulating adhesive is adhered to a conductive layer on a surface opposite said undercoating agent.

13. The multilayer printed circuit board according to claim 11, wherein said internal layer circuit board comprises a substrate with a metallic circuit on a surface thereof, and said undercoating agent covers said surface of said substrate and said metallic circuit, and wherein the distance between said surface of said substrate and the surface of said solid form insulating adhesive in facing relation with said undercoating agent is substantially constant.

14. A multilayer printed circuit board comprising a laminate of:

a substrate comprising an epoxy resin impregnated glass cloth;

a printed circuit adhered to a face of said substrate, said printed circuit constituting an internal layer circuit;

an undercoating layer adhered to said substrate and filling spaces on said surface of said substrate not occupied by said printed circuit, whereby the thicknesses of said undercoating layer and said printed circuit are substantially the same, said undercoating layer comprising a curing agent-cured epoxy resin;

an insulating adhesive layer of 15–120 μm thickness over and adhering to said undercoating layer and said printed circuit, said insulating adhesive consisting essentially of (a) a bisphenol epoxy resin or phenoxy resin having a weight average molecular weight of at least 10,000, (b) a bisphenol epoxy resin having an epoxy equivalent of not more than 500, and (c) an epoxy resin curing agent consisting of at least one member selected from the group consisting of 2-methylimidazole, 2-phenylimidazole, 2-phenyl-4-methylimidazole, bis(2-ethyl-4-methylimidazole), 2-phenyl-4-methyl-5-hydroxymethylimidazole, 2-phenyl-4,5-dihydroxy-methylimidazole, triazine-addition imidazole, methyltetrahydrophthalic anhydride, methylendomethylene tetrahydrophthalic anhydride, methylbutenyltetrahydrophthalic anhydride, hexahydrophthalic anhydride, methyl-hexahydrophthalic anhydride, and mixtures thereof; and a copper foil overlaying and adhered to said insulating adhesive layer.

15. The multilayer printed circuit board according to claim 14, wherein the component (a) is contained in a proportion of 55–90% by weight based on the total weight of the component (a) and the component (b).

16. The multilayer printed circuit board according to claim 14, wherein the component (b) is a bisphenol epoxy resin having an epoxy equivalent of about 200 or a bisphenol epoxy resin having an epoxy equivalent of about 450 or a combination of the two.

17. The multilayer printed circuit board according to claim 14, wherein the component (a) is a brominated bisphenol epoxy resin or brominated phenoxy resin having a bromination degree of at least 20% and a weight average molecular weight of at least 10,000.

18. The multilayer printed circuit board according to claim 17, wherein the brominated bisphenol epoxy resin is produced from bisphenol A or bisphenol F.

19. The multilayer printed circuit board according to claim 17, wherein the component (a) is contained in a proportion of 55–90% by weight based on the total weight of the component (a) and the component (b).

20. The multilayer printed circuit board according to claim 14, wherein the component (a) is a brominated bisphenol epoxy resin or brominated phenoxy resin which has a repeating structure wherein brominated bisphenol portion and unbrominated bisphenol portion are alternately arranged and which has a bromination degree of at least 20% and a weight average molecular weight of at least 10,000.

\* \* \* \* \*